(12) United States Patent
Kim et al.

(10) Patent No.: US 7,713,873 B2
(45) Date of Patent: May 11, 2010

(54) METHODS OF FORMING CONTACT STRUCTURES SEMICONDUCTOR DEVICES

(75) Inventors: Seong-Goo Kim, Seoul (KR); Hyeong-Sun Hong, Gyeonggi-do (KR); Dong-Hyun Kim, Gyeonggi-do (KR); Nam-Jung Kang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 107 days.

(21) Appl. No.: 12/151,997

(22) Filed: May 12, 2008

(65) Prior Publication Data

US 2008/0284029 A1 Nov. 20, 2008

(30) Foreign Application Priority Data

May 16, 2007 (KR) .............. 10-2007-0047556

(51) Int. Cl.
*H01L 21/44* (2006.01)

(52) U.S. Cl. .............. 438/672; 438/700; 438/238; 438/381; 257/E21.304; 257/E21.552; 257/E21.577; 257/E21.645; 257/E21.646

(58) Field of Classification Search ............ 438/672, 438/637, 692, 700, 270, 257, 258, 297, 238, 438/381
See application file for complete search history.

(56) References Cited

U.S. PATENT DOCUMENTS

| | | | | |
|---|---|---|---|---|
| 6,521,934 | B2 * | 2/2003 | Yasuda ............ | 257/296 |
| 6,586,815 | B2 * | 7/2003 | Ohhashi ............ | 257/529 |
| 6,599,794 | B2 * | 7/2003 | Kiyotoshi et al. ...... | 438/240 |
| 6,770,535 | B2 | 8/2004 | Yamada et al. ......... | 438/270 |
| 7,094,674 | B2 | 8/2006 | Graf et al. ............ | 438/598 |

(Continued)

FOREIGN PATENT DOCUMENTS

KR 10-2000-0045435 A 7/2000

(Continued)

OTHER PUBLICATIONS

Decision to Grant Patent & English Translation for Corresponding Korean Patent Application No. 10-2007-0047556, May 27, 2008, (2pgs.).

*Primary Examiner*—David Nhu
(74) *Attorney, Agent, or Firm*—Myers Bigel Sibley & Sajovec, P.A.

(57) ABSTRACT

Methods of forming a contact structure in a semiconductor device include providing a semiconductor substrate including active regions and word lines crossing the active regions. A first interlayer dielectric layer is formed on the semiconductor substrate. Direct contact plugs are formed extending through the first interlayer dielectric layer to contact selected ones of the active regions. Bit line structures are formed on the first interlayer dielectric layer and crossing the word lines that are coupled to the selected ones of the active regions by the direct contact plugs. A second interlayer dielectric layer is formed on the semiconductor substrate including the bit line structures. Barrier patterns are formed extending in parallel with bit line structures and into the second interlayer dielectric layer. Mask patterns are formed overlying an entirety of top surfaces of the direct contact plugs on the second interlayer dielectric layer and the bit line structures. The second and first interlayer dielectric layers are etched using the mask patterns, the barrier patterns and the bit line structures as an etching mask to form buried contact holes and buried contact plugs are formed in the buried contact holes.

14 Claims, 9 Drawing Sheets

U.S. PATENT DOCUMENTS 7,572,721 B2 * 8/2009 Kim .......................... 438/586
2007/0054482 A1 * 3/2007 Nakajima et al. ........... 438/597

FOREIGN PATENT DOCUMENTS

| KR | 1020050025508 | 3/2005 |
| KR | 1020060059037 | 6/2006 |
| KR | 1020060108432 | 10/2006 |
| KR | 10-2007-0010914 A | 1/2007 |

* cited by examiner

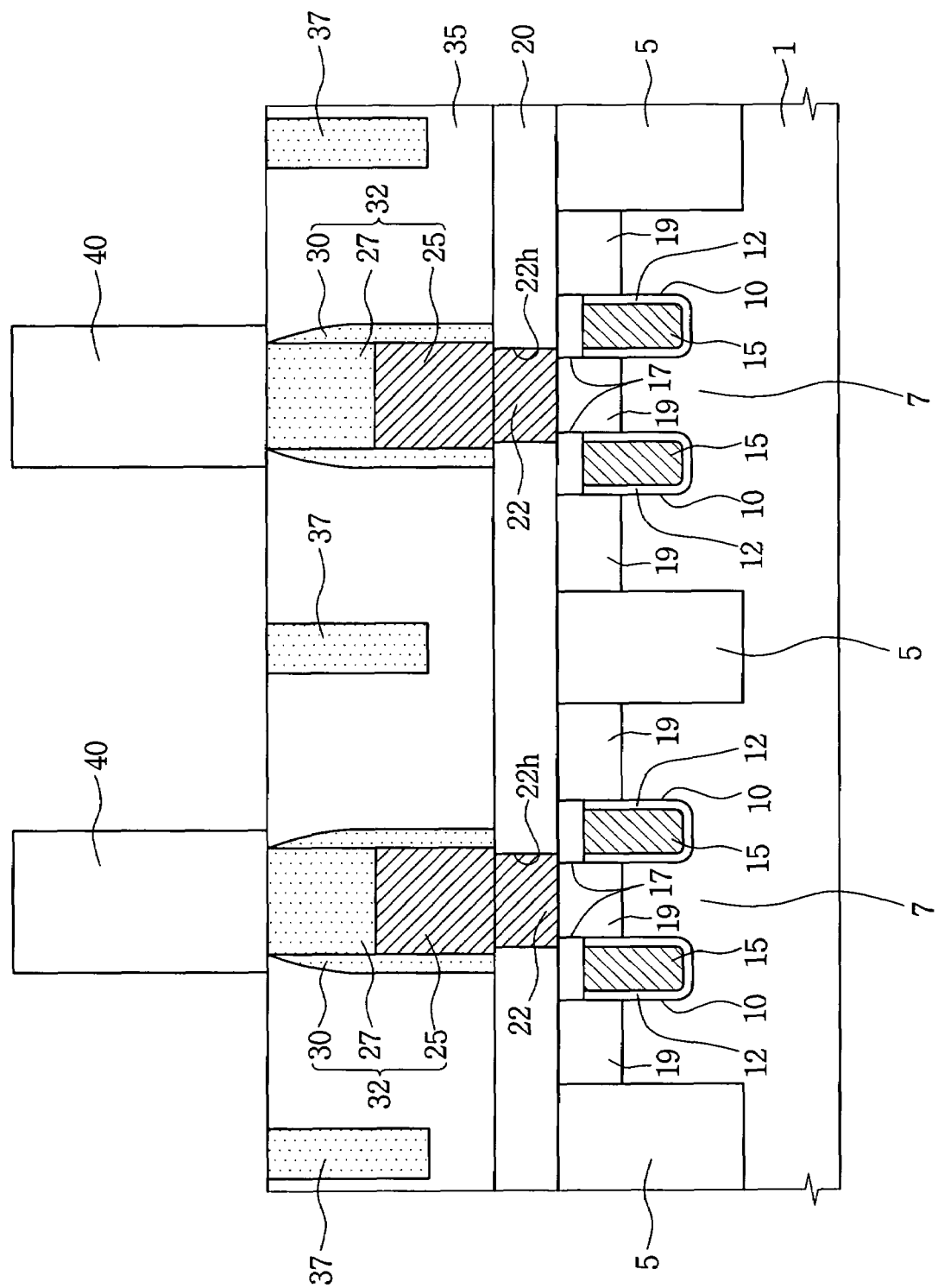

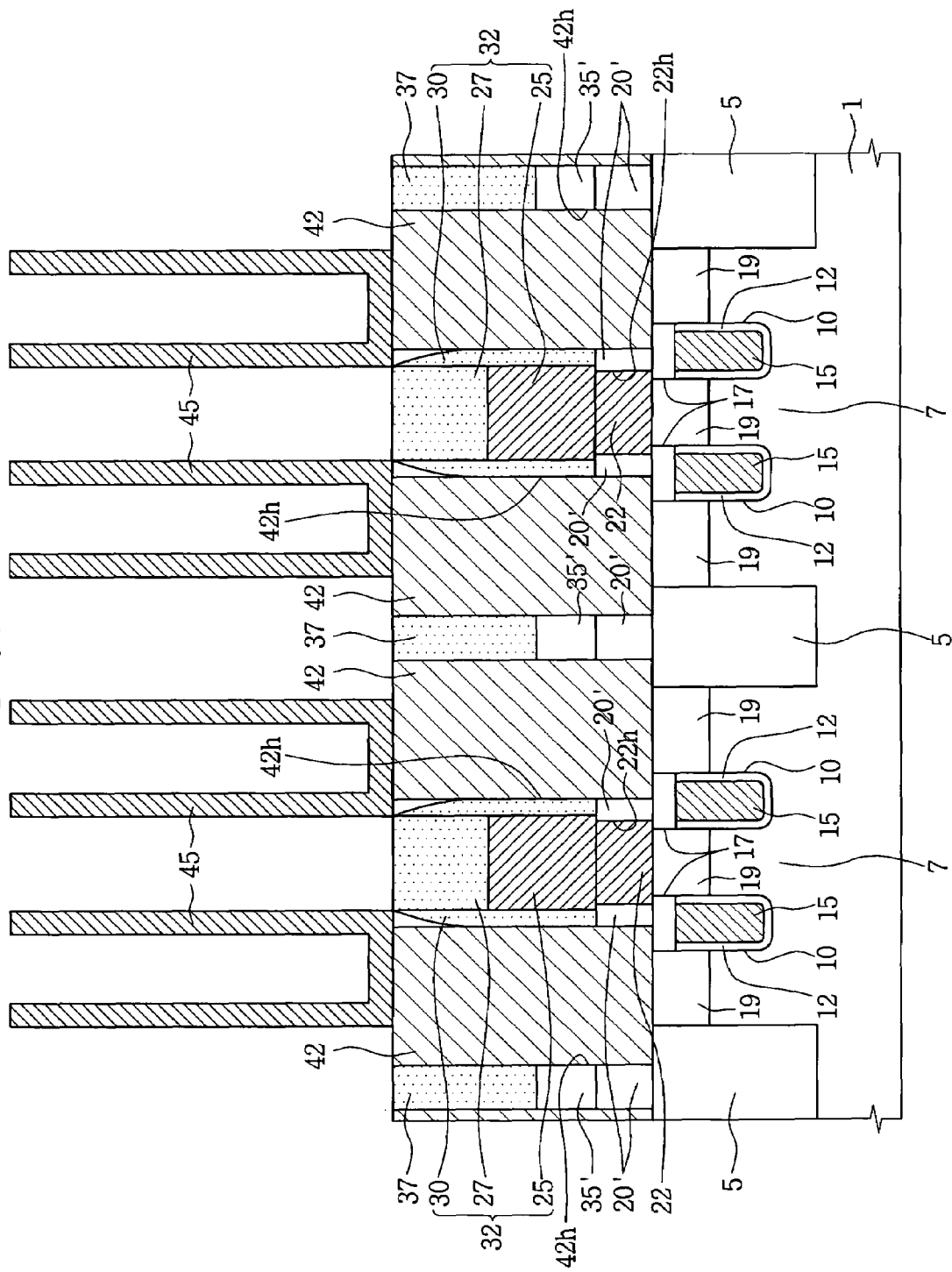

METHODS OF FORMING CONTACT STRUCTURES SEMICONDUCTOR DEVICES

CROSS-REFERENCE TO RELATED APPLICATION

This application claims priority from Korean Patent Application No. 10-2007-0047556, filed May 16, 2007, the disclosure of which is hereby incorporated herein by reference in its entirety as if set forth fully herein.

BACKGROUND OF THE INVENTION

The present invention relates to semiconductor devices and methods of forming the same, and more particularly, to a contact structure in semiconductor devices and methods of forming the same.

As semiconductor devices become more highly integrated, it is generally more difficult to ensure stable operations of transistors therein. A recess channel array transistor (RCAT) has been introduced as a transistor structure addressed to improving problems, such as a short channel effect, while reducing the size of a transistor.

In the RCAT, a gate electrode is typically positioned to protrude upward from a semiconductor substrate. As a result, it may be difficult to perform subsequent processes, such as a contact plug formation process and a planarization process, due to the protruded gate electrode. An upper corner of a recessed channel region may cause the generation of a leakage current due to a field crowding effect. Also, a difficult patterning process is typically required to form the protruded gate electrode.

Studies on a buried channel array transistor (BCAT) have been conducted to address the aforementioned problems. For example, a semiconductor device having buried word lines is disclosed in U.S. Pat. No. 6,770,535(B2), entitled "Semiconductor integrated circuit device and process for manufacturing the same" to Yamada, et al.

In the BCAT, a gate electrode is typically buried in a semiconductor substrate. A capping pattern is formed on the buried gate electrode. The capping pattern is generally formed to have the same level as a top surface of the semiconductor substrate. That is, the buried gate electrode is formed to have a lower level than the top surface of the semiconductor substrate due to the capping pattern. Source/drain regions are generally formed in the semiconductor substrate on both sides of the buried gate electrode.

Semiconductor devices, such as dynamic random access memories (DRAMs), may include a plurality of BCATs. These semiconductor devices typically include interconnections between components thereof, such as bit lines and capacitor electrodes that act as storage nodes. For example, a semiconductor substrate having the BCAT is typically covered by a lower interlayer dielectric layer. The bit lines are generally arranged on the lower interlayer dielectric layer. The bit line generally is connected to a selected one of a plurality of source/drain regions through a direct contact plug. The direct contact plug may be formed in a contact hole extending through the lower interlayer dielectric layer.

An upper interlayer dielectric layer is generally formed that covers the bit lines. Buried contact plugs may be formed to sequentially pass through the upper and lower interlayer dielectric layers and then contact the source/drain regions at both sides of the bit lines. Storage nodes may be formed on the buried contact plugs.

BCATs generally have a reduced structure as compared with the RCATs. As such, methods of forming a contact plug used for RCATs may not be directly applied to BCATs. In particular, a patterning process having a relatively high degree of difficulty may be needed for forming contact holes in BCATs. The more difficult patterning process may cause degradation of production efficiency and an increase of manufacturing costs for the BCATs.

SUMMARY OF THE INVENTION

Some embodiments of the present invention provide methods of forming a contact structure in a semiconductor device including providing a semiconductor substrate including active regions and word lines crossing the active regions. A first interlayer dielectric layer is formed on the semiconductor substrate. Direct contact plugs are formed extending through the first interlayer dielectric layer to contact selected ones of the active regions. Bit line structures are formed on the first interlayer dielectric layer and crossing the word lines that are coupled to the selected ones of the active regions by the direct contact plugs. A second interlayer dielectric layer is formed on the semiconductor substrate including the bit line structures. Barrier patterns are formed extending in parallel with bit line structures and into the second interlayer dielectric layer. Mask patterns are formed overlying an entirety of top surfaces of the direct contact plugs on the second interlayer dielectric layer and the bit line structures. The second and first interlayer dielectric layers are etched using the mask patterns, the barrier patterns and the bit line structures as an etching mask to form buried contact holes and buried contact plugs are formed in the buried contact holes.

In further embodiments, the word lines are buried word lines having an upper surface below a top surface of the active regions and/or protruded word lines having an upper surface above the top surface of active regions. The bit line structures may include a bit line conductive pattern, a bit line capping pattern on the bit line conductive pattern and bit line spacers covering sidewalls of the bit line conductive pattern and the bit line capping pattern.

In other embodiments, forming the direct contact plugs and forming the bit line structures includes patterning the first interlayer dielectric layer to form direct contact holes exposing the selected ones of the active regions. A bit line conductive layer is formed filling the direct contact holes. A bit line capping layer is formed on the bit line conductive layer. The bit line capping layer and the bit line conductive layer are sequentially patterned to form the direct contact plugs, the bit line conductive pattern and the bit line capping pattern and bit line spacers are formed covering sidewalls of the bit line conductive pattern and the bit line capping pattern. The bit line capping pattern and the bit line spacers may be formed of a material having an etching selectivity with respect to the first and second interlayer dielectric layers. The barrier patterns may be formed between the bit line structures.

In other embodiments, forming the barrier patterns includes patterning the second interlayer dielectric layer in a direction parallel with the bit line structures to define grooves therein and forming an insulating layer filling the grooves. The barrier patterns may be formed to be self-aligned with respect to the bit line structures. The second interlayer dielectric layer may have grooves therein between the bit line structures. Forming the barrier patterns may include forming an insulating layer to fill the grooves in the second interlayer dielectric layer and planarizing the semiconductor substrate including the insulating layer in the grooves to expose top surfaces of the bit line structures.

In further embodiments, the barrier patterns are formed of a material having an etching selectivity with respect to the first and second interlayer dielectric layers. The mask patterns may be photoresist patterns and/or hard mask patterns.

In other embodiments, etching the second and first interlayer dielectric layers to form the buried contact holes is followed by removing the mask patterns. The bit line structures may be formed to have a predetermined substantially fixed width or having a width of a region contacting the direct contact plugs that is broader than that of a region that does thereof that does not contact the direct contact plugs.

In yet further embodiments, a contact structure in a semiconductor device includes a semiconductor substrate including active regions and word lines crossing the active regions. Bit line structures are on the semiconductor substrate that contact the active regions through direct contact plugs and cross the word lines. Barrier patterns are arranged parallel with the bit line structures on the semiconductor substrate between the bit line structures. Buried contact plugs extend symmetrically about each of the bit line structures between the bit line structures and adjacent ones of the barrier patterns and insulating layer patterns fill a region between the bit line structures and the barrier patterns overlying a portion of an underlying one of the direct contact plugs.

In other embodiments the word lines are buried word lines having an upper surface below a top surface of the active regions and/or protruded word lines having an upper surface above the top surface of active regions. The bit line structures may include a bit line conductive pattern, a bit line capping pattern on the bit line conductive pattern and bit line spacers covering sidewalls of the bit line conductive pattern and the bit line capping pattern. The bit line capping pattern and the bit line spacers may be a material having an etching selectivity with respect to the insulating layer patterns. The barrier patterns may be a material having an etching selectivity with respect to the insulating layer patterns. The bit line structures may be formed to have a predetermined substantially fixed width or having a width of a region contacting the direct contact plugs that is broader than that of a region that does thereof that does not contact the direct contact plugs.

BRIEF DESCRIPTION OF THE DRAWINGS

The above and other features and advantages of the present invention will become more apparent to those of ordinary skill in the art by describing in detail some embodiments thereof with reference to the attached drawings in which:

FIGS. 2A through 2E are cross-sectional views, taken along line I-I' in FIGS. 1A and 1B, that illustrate methods of forming the contact structure of FIGS. 1A and 1B according to some embodiments of the present invention.

DETAILED DESCRIPTION OF EMBODIMENTS OF THE INVENTION

Figure 1A:
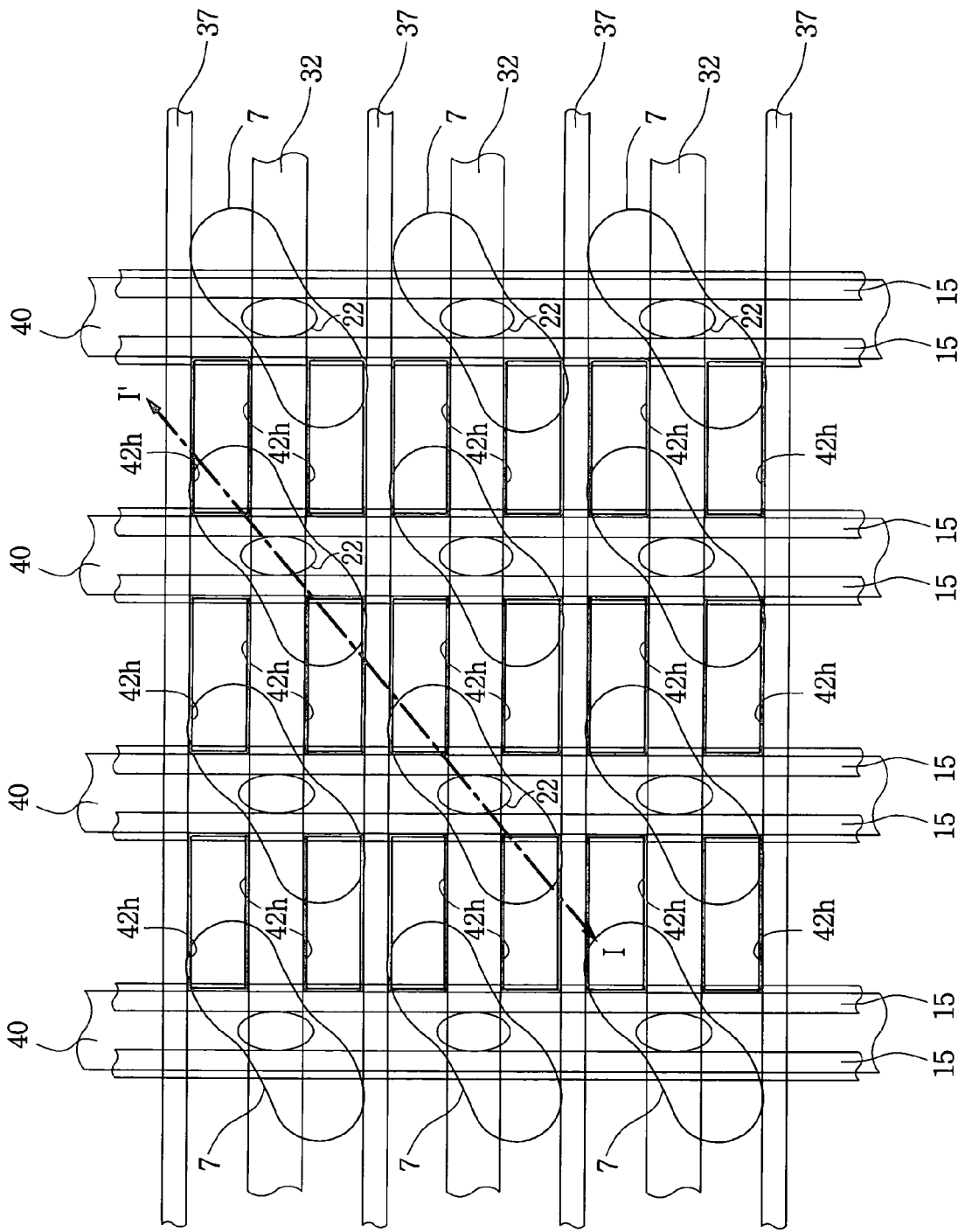
FIGS. 1A and 1B are plan views illustrating a contact structure in a semiconductor device and methods of forming the same according to some embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Figure 1B:
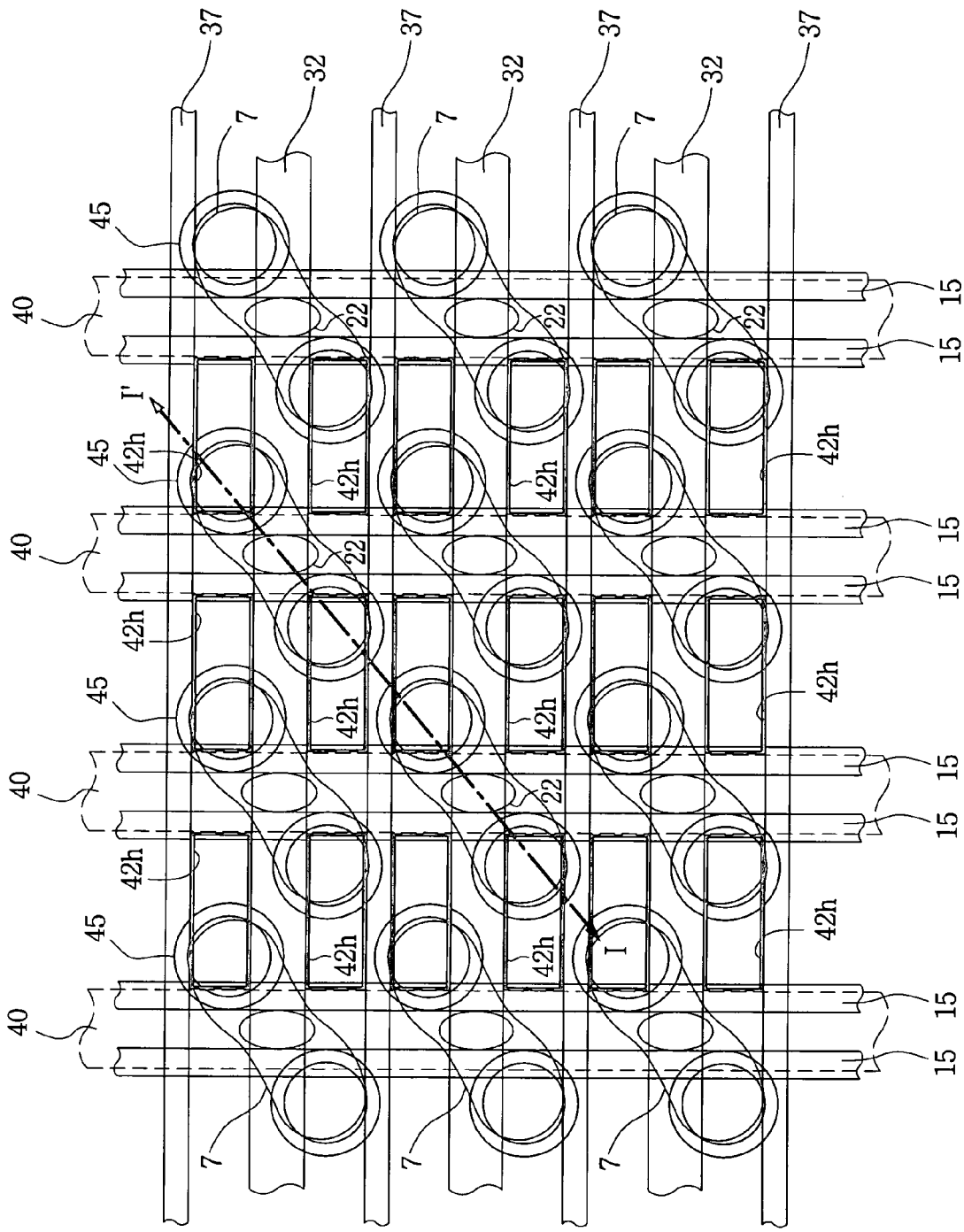

Referring to the figures, FIGS. 1A and 1B are plan views illustrating a method of forming a contact structure in a semiconductor (integrated circuit) device according to some embodiments of the present invention, and FIGS. 2A through 2E are cross-sectional views taken along line I-I' in FIGS. 1A and 1B further illustrating the method of forming the contact structure in the semiconductor device according to some embodiments of the present invention. For purposes of simplifying the description herein, the described semiconductor device may be a dynamic random access memory (DRAM).

Figure 2A:
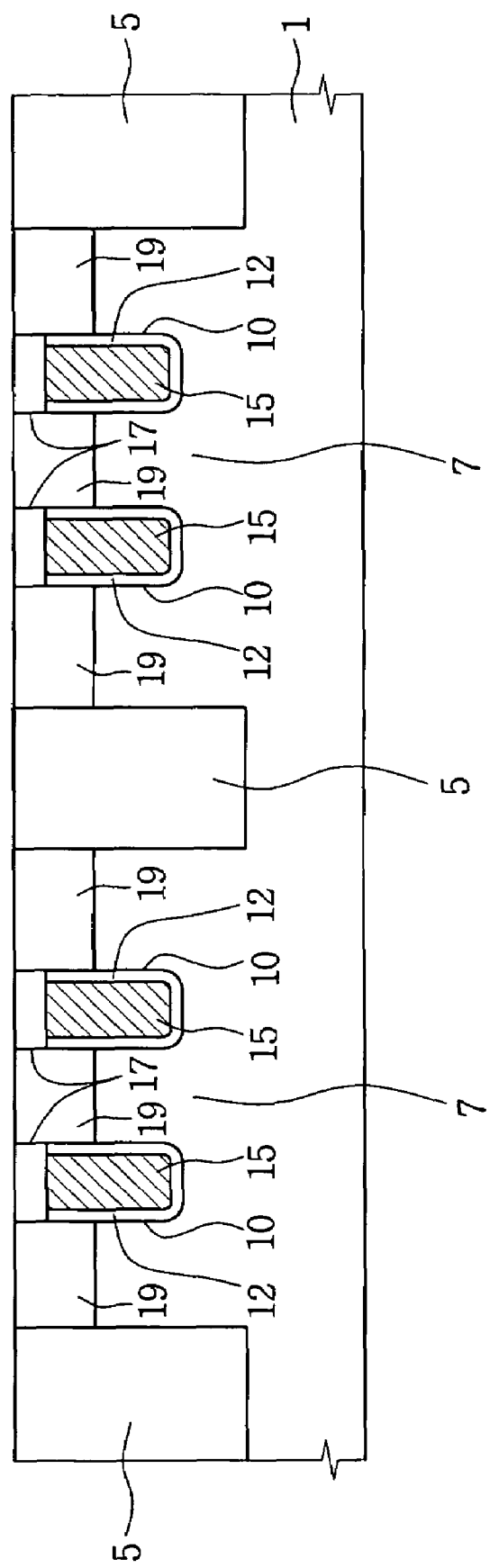

Referring to FIGS. 1A and 2A, an isolation layer 5 that defines an active region 7 is formed in a semiconductor (integrated circuit) substrate 1. The semiconductor substrate 1 may be a silicon wafer. Impurity regions, such as n-wells and/or p-wells, may be formed in the semiconductor substrate 1. The isolation layer 5 may be formed using a shallow trench isolation (STI) method. The isolation layer 5 may include an insulating layer, such as a silicon oxide layer, a silicon nitride layer and/or a silicon oxynitride layer (i.e., one or a combination of such layers). As illustrated in the embodiments of FIG. 1A, the active region 7 may include a plurality of active regions electrically isolated from one another and regularly arranged in the semiconductor substrate 1.

Gate trenches 10 intersecting the active region 7 are formed in the semiconductor substrate 1. The gate trenches 10 may be formed to have a narrower width than a limiting resolution required in a photolithography process. Gate insulating layers 12 are formed on surfaces of the active region 7 exposed in the gate trenches 10. Buried gate electrodes 15 partially filling the gate trenches 10 are formed on the gate insulating layers 12. Capping patterns 17 completely filling the gate trenches 10 are formed on the buried gate electrodes 15. Source/drain regions 19 are formed in the active region 7 at both sides of each of the buried gate electrodes 15. The source/drain regions 19 may include common source/drain regions in the active region 7 between the buried gate electrodes 15.

The isolation layer 5, the active region 7 and the capping patterns 17 may all be exposed on the same plane. The gate trenches 10 may be formed to cross the active region 7 and the isolation layer 5. The gate trenches 10 may be formed to be parallel with one another. The buried gate electrodes 15 may extend to serve as buried word lines 15. The buried gate electrodes 15 may be formed at a lower level than top surfaces of the active regions 7 as shown in FIG. 2A.

In some embodiments of the present invention, when a semiconductor device has a recess channel array transistor (RCAT), word lines may be formed as protruded word lines intersecting the top surface of the semiconductor substrate 1.

The gate trenches 10 may be formed to have various shapes, such as a trapezoid, a lower portion of which has a greater width than an upper portion thereof, or a flask having its spherical lower portion extended. Hereinafter, the gate trenches 10 will be explained with reference to an example shape, in which upper and lower portions of each trench have a same width and its lower corners are rounded as seen in FIG. 2A.

The gate insulating layer 12 may include a silicon oxide layer, a silicon nitride layer, a silicon oxynitride layer and/or a high-k dielectric layer. The buried gate electrode 15 may include a metal layer, a metal silicide layer and/or a poly-silicon layer. For example, the buried gate electrode 15 may include a TiSi layer.

The capping pattern 17 may include a silicon oxide layer, a silicon nitride layer and/or a silicon oxynitride layer. For example, the capping pattern 17 may include a silicon nitride layer.

The source/drain regions 19 may be formed by implanting impurity ions into the active region 7 at both sides of the buried gate electrode 15. The source/drain regions 19 may be formed to have different conductivity type from the semiconductor substrate 1. For example, the semiconductor substrate 1 may include p-type impurity ions, and the source/drain regions 19 may include n-type impurity ions.

Figure 2B:
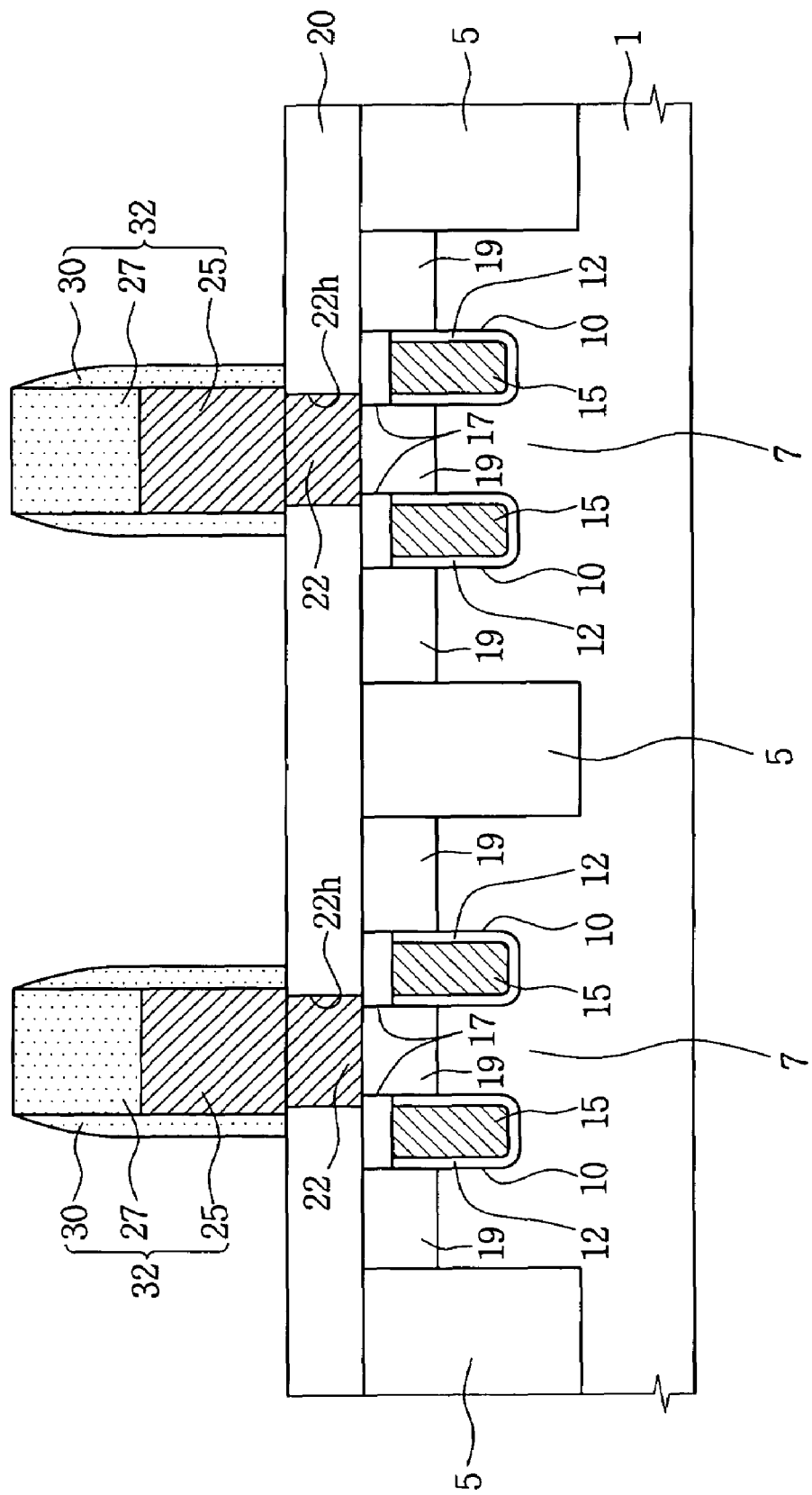

Referring to FIGS. 1A and 2B, a first interlayer dielectric layer 20 is formed on the semiconductor substrate 1 including the capping patterns 17. The first interlayer dielectric layer 20 may be formed of a silicon oxide layer. The first interlayer dielectric layer 20 may be formed to have a planarized top surface. The first interlayer dielectric layer 20 is patterned to form direct contact holes 22h, each exposing a selected one of the source/drain regions 19. Direct contact plugs 22 are formed that fill the direct contact holes 22h, for example, by a damascene process.

Bit line structures 32 contacting the direct contact plugs 22 are formed on the first interlayer dielectric layer 20. The bit line structure 32 may include a bit line conductive pattern 25 and a bit line capping pattern 27 stacked thereon, and may further include bit line spacers 30 covering sidewalls of the stacked bit line conductive pattern 25 and bit line capping pattern 27.

More particularly, a bit line conductive layer and a bit line capping layer may be sequentially formed on the semiconductor substrate 1 including the direct contact plugs 22, and the bit line capping layer and the bit line conductive layer may be sequentially patterned to form the stacked bit line conductive pattern 25 and bit line capping pattern 27. Subsequently, the bit line spacers 30 may be formed to cover sidewalls of the stacked bit line conductive pattern 25 and bit line capping pattern 27.

The first interlayer dielectric layer 20 is patterned to form the direct contact holes 22h directly exposing the active regions 7. A bit line conductive layer for filling the direct contact holes 22h is formed on the semiconductor substrate 1 including the direct contact holes 22h. A bit line capping layer is formed on the bit line conductive layer. The bit line capping layer and the bit line conductive layer may be sequentially patterned, thereby simultaneously forming the direct contact plugs 22 and the stacked bit line conductive pattern 25 and bit line capping pattern 27. Subsequently, bit line spacers 30 are formed to cover sidewalls of the stacked bit line conductive pattern 25 and bit line capping pattern 27.

Each of the direct contact plug 22 and the bit line conductive pattern 25 may include a conductive layer, such as a metal layer, a metal silicide layer, a poly-silicon layer and/or a combination layer thereof. For example, the direct contact plug 22 may include a tungsten layer and a barrier metal layer surrounding sidewalls and a bottom of the tungsten layer. The bit line capping pattern 27 and the bit line spacers 30 may be formed of a material having an etching selectivity with respect to the first interlayer dielectric layer 20. The bit line capping pattern 27 and the bit line spacers 30 may be formed of a silicon nitride layer.

The bit line structures 32 may be formed to have a predetermined width. The bit line structures 32 may be formed such that the width of a region contacting the direct contact plugs 22 is broader than that of a region that does not contact the direct contact plugs 22. That is, as viewed on a plan view, the bit line structures 32 may be formed to have convex portions at the region contacting the direct contact plugs 22.

Referring to FIGS. 1A and 2C, a second interlayer dielectric layer 35 is formed on the semiconductor substrate 1 including the bit line structures 32. Barrier patterns 37 parallel with the bit line structures 32 and extending into the second interlayer dielectric layer 35 are formed in the semiconductor substrate 1 including the second interlayer dielectric layer 35. The barrier patterns 37 may be formed between the bit line structures 32.

As shown in FIG. 2C, the second interlayer dielectric layer 35 is formed along step difference spacings of the bit line structures 32 to have grooves in the second interlayer dielectric layer 35. A method of forming the barrier patterns 37 may include forming an insulating layer on the semiconductor substrate 1 including the second interlayer dielectric layer 35, such that the grooves are filled, and planarizing the semiconductor substrate 1 including the insulating layer until top surfaces of the bit line structures 32 are exposed. Thus, self-aligned barrier patterns 37 may be formed between the bit line structures 32. The self-aligned barrier patterns 37 may be formed to have a narrower width than a limiting resolution required in a photolithography process.

The second interlayer dielectric layer 35 may be patterned in a direction parallel with the bit line structures 32, thereby forming grooves in the second interlayer dielectric layer 35. The barrier patterns 37 may be formed by forming an insulating layer filling the grooves. The grooves may be formed to extend through to the first interlayer dielectric layer 20.

The barrier pattern 37 may be formed of a material having an etching selectivity with respect to the first and second interlayer dielectric layers 20 and 35. The barrier pattern 37 may include a silicon nitride layer. The barrier pattern 37 may include a same material layer as the bit line capping pattern 27 and the bit line spacers 30.

Mask patterns 40 aligned to overly top surfaces of the direct contact plugs 22 and extending to the bit line structures 32 in a vertical direction are formed on the semiconductor substrate 1 including the barrier patterns 37. The mask patterns 40 may include photoresist patterns and/or hard mask patterns.

Figure 2D:
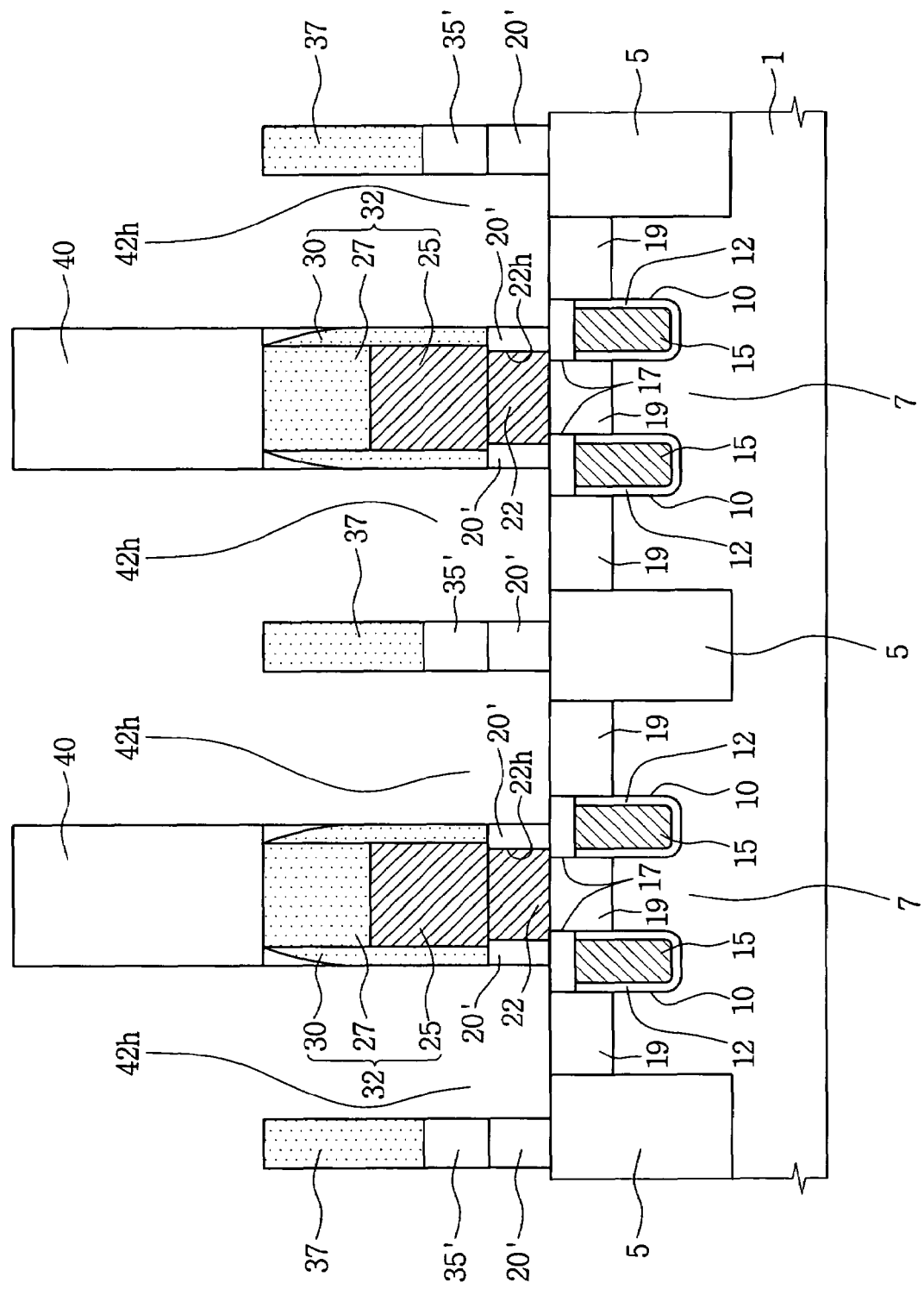

Referring to FIGS. 1A and 2D, the second and first interlayer dielectric layers 35 and 20 are sequentially etched using the mask patterns 40, the barrier patterns 37 and the bit line structures 32 as an etching mask, thereby forming buried contact holes 42h exposing the source/drain regions 19. As a result, first and second interlayer dielectric patterns 20' and 35' may be formed. The buried contact holes 42h may be formed to expose sidewalls of the barrier patterns 37, sidewalls of the bit line structures 32 and sidewalls of the first and second interlayer dielectric patterns 20' and 35'. The buried contact holes 42h may be formed to be symmetric about the bit line structures 32. When the bit line structures 32 have a predetermined width, the buried contact holes 42h may be formed into a rectangular structure as viewed on a plan view in FIG. 1A.

As the mask patterns 40 overly the top surfaces of the direct contact plugs 22, the direct contact plugs 22 are not exposed by the buried contact holes 42h even if the bit line structures 32 are misaligned and the top surfaces of the direct contact plugs 22 are not fully covered by the bit line structures 32. The buried contact holes 42h may be formed to have an area as broad as possible, using the bit line structure 32 and the mask patterns 40 having line and space patterns intersecting the bit line structure 32 in a vertical direction. Additionally, the arrangement accuracy of the buried contact holes 42h may be increased using the self-aligned barrier patterns 37.

Referring to FIGS. 1B and 2E, after forming the buried contact holes 42h, the mask patterns 40 are removed. Buried contact plugs 42 filling the buried contact holes 42h are formed. More particularly, a conductive layer filling the buried contact holes 42h may be formed and then planarized such that the top surfaces of the bit line structures 32 and the barrier patterns 37 are exposed. An etchback process and/or chemical mechanical polishing (CMP) process may be used as the planarization process. The buried contact plug 42 may include a conductive layer, such as a metal layer, a metal silicide layer, a poly-silicon layer and/or a combination layer thereof.

Storage nodes 45 are formed contacting the respective buried contact plugs 42, which storage nodes 45 may be formed using a conventional method in some embodiments. The storage node(s) 45 may include a conductive layer, such as a metal layer, a metal silicide layer, a poly-silicon layer and/or a combination layer thereof. The storage nodes 45 may be electrically connected to the source/drain regions 19 through the buried contact plugs 42. The storage nodes 45 may be lower electrodes of capacitors.

Figure 3A:
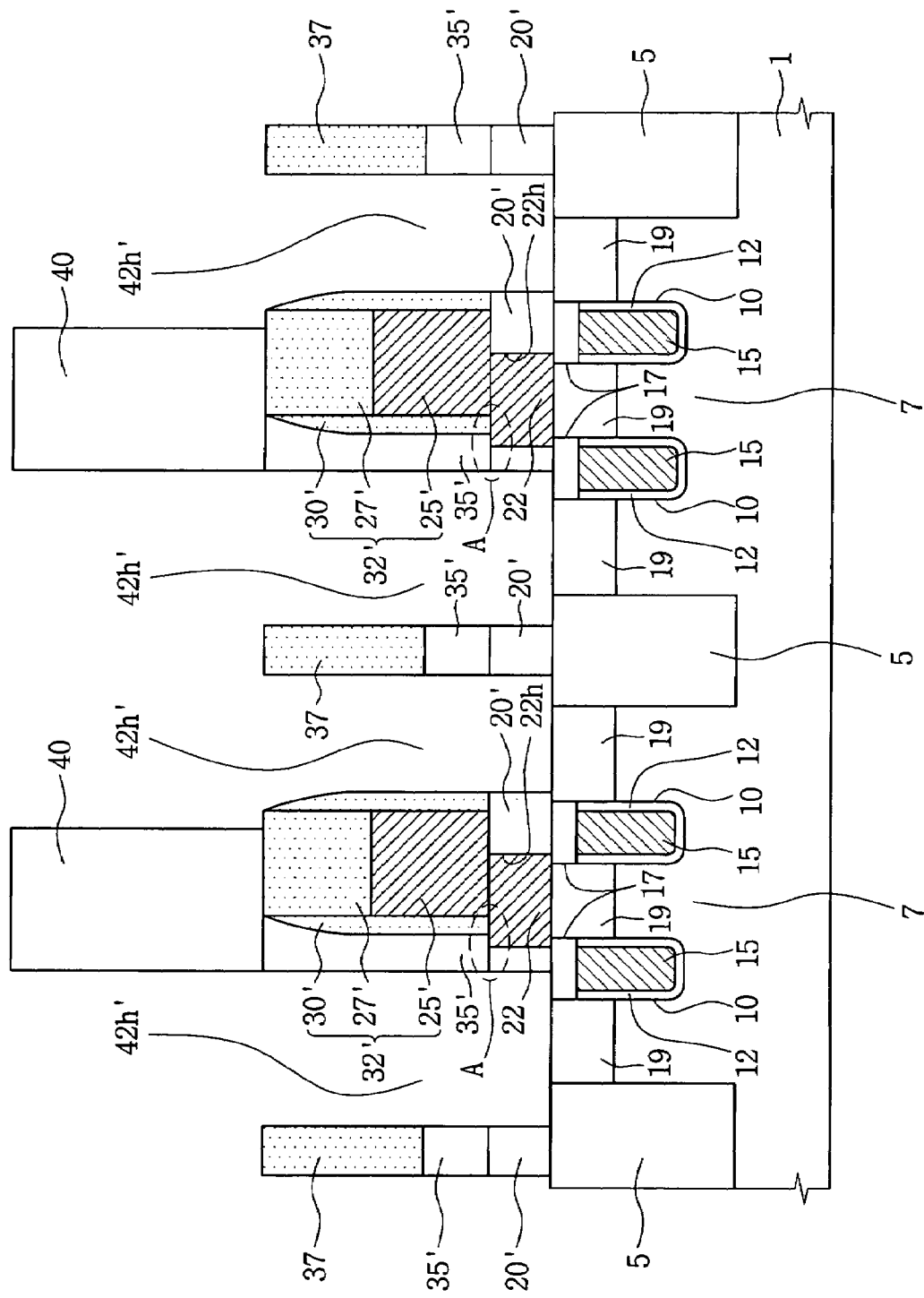
FIGS. 3A and 3B are cross-sectional views, taken along line I-I' of FIG. 1A, illustrating a case where bit line structures are misaligned in the method of forming the contact structure in the semiconductor device according to some embodiments of the present invention.
Figure 3B:
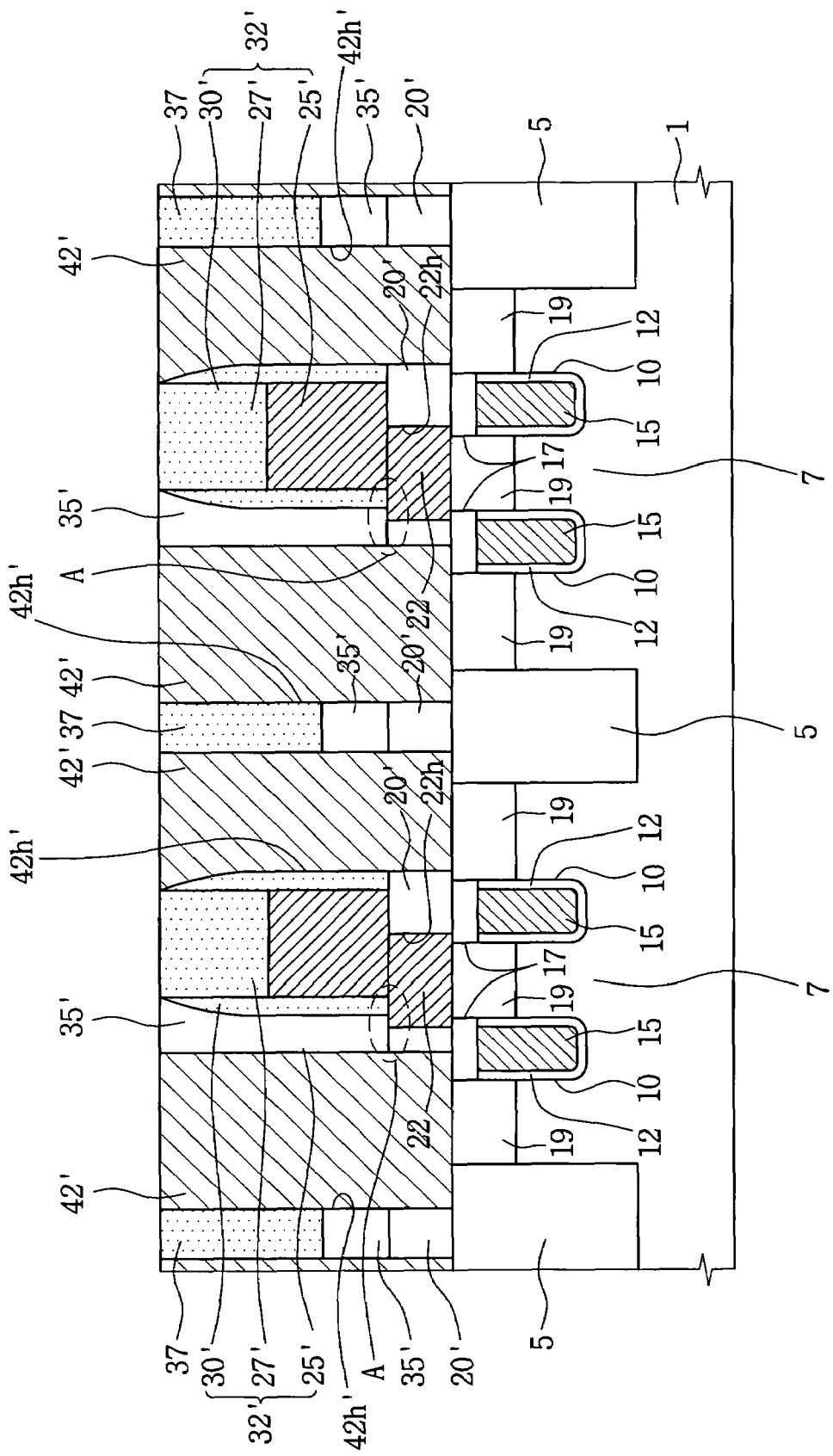

FIGS. 3A and 3B are cross-sectional views taken along line I-I' of FIG. 1A illustrating a case where bit line structures are misaligned in a method of forming the contact structure in the semiconductor device according to some embodiments of the present invention.

Referring to FIGS. 1A and 3A, isolation layers 5 defining an active region 7 are formed in a semiconductor substrate 1 using the processes described with reference to FIGS. 2A and 2B. As illustrated in FIG. 1A, the active region 7 may include a plurality of active regions electrically isolated from one another and regularly arranged in the semiconductor substrate 1.

Gate trenches 10 intersecting the active region 7 are formed in the semiconductor substrate 1. The gate trenches 10 may be formed to have a narrower width than a limiting resolution required in a photolithography process. Gate insulating layers 12 are formed on surfaces of the active region 7 exposed in the gate trenches 10. Buried gate electrodes 15 partially filling the gate trenches 10 are formed on the gate insulating layers 12. Capping patterns 17 completely filling the gate trenches 10 are formed on the buried gate electrodes 15. Source/drain regions 19 are formed in the active region 7 at both sides of each of the buried gate electrodes 15. The source/drain regions 19 may include common source/drain regions in the active region 7 between the buried gate electrodes 15.

The gate trenches 10 may be formed to intersect the active region 7 and the isolation layer 5. The gate trenches 10 may be formed to be parallel with one another. In this case, the buried gate electrodes 15 may extend to serve as buried word lines 15.

A first interlayer dielectric layer is formed on the semiconductor substrate 1 including the capping patterns 17. The first interlayer dielectric layer is patterned, thereby forming direct contact holes 22h, each exposing a selected one of the source/drain regions 19. Subsequently, direct contact plugs 22 are formed that fill the direct contact holes 22h, for example, using a conventional damascene process.

Bit line structures 32' contacting the direct contact plugs 22 are formed on the first interlayer dielectric layer. The bit line structure 32' may include a bit line conductive pattern 25', a bit line capping pattern 27', which are sequentially stacked, and bit line spacers 30' covering sidewalls of the bit line conductive pattern 25' and the bit line capping pattern 27'. The bit line structures 32' may be misaligned. As a result, a portion of top surfaces of the direct contact plugs 22 may be partially exposed as shown in region A of FIG. 3A. The misaligned structures 32' are not illustrated in the plan view of FIG. 1A.

Subsequently, a second interlayer dielectric layer is formed on the semiconductor substrate 1 including the bit line structures 32', using the processes described with reference to corresponding structures in FIGS. 2C and 2D. Barrier patterns 37 parallel with the bit line structures 32 and extending into the second interlayer dielectric layer 35 are formed on the semiconductor substrate 1 including the second interlayer dielectric layer. The barrier patterns 37 may be formed between the bit line structures 32'. When forming the barrier patterns 37 through a self-aligning method using the bit line structures 32' as described in FIG. 2C, the barrier patterns 37 may also be arranged asymmetrically relative to the misaligned bit line structures 32' as seen in FIG. 3A.

Mask patterns 40 overlapping exposed top surfaces of the direct contact plugs 22 and extending to the bit line structures 32' in a vertical direction are formed on the semiconductor substrate 1 including the barrier patterns 37. The mask patterns 40 may be line and space patterns. The first and second interlayer dielectric layers may be sequentially etched using the mask patterns 40, the barrier patterns 37 and the bit line structures 32' as an etching mask, thereby forming buried contact holes 42h' exposing the source/drain regions 19. As a result, first and second interlayer dielectric patterns 20' and 35' are formed from remaining portions of the first and second interlayer dielectric layers. The buried contact holes 42h' may be formed to expose sidewalls of the barrier patterns 37, the bit line structures 32' and the first and second interlayer dielectric patterns 20' and 35'.

As the mask patterns 40 cover the top surfaces of the direct contact plugs 22, the direct contact plugs 22 are not exposed by the buried contact holes 42h' even when the bit line structures 32 are misaligned and expose portions of the top surfaces of the direct contact plugs 22 (region A).

Referring to FIGS. 1A and 3B, after forming the buried contact holes 42h', the mask patterns 40 are removed. Buried contact plugs 42' are formed filling the buried contact holes 42h'. As shown in region A, the buried contact plugs 42' may be insulated from the bit line structures 32' by the direct contact plugs 22 and the first and second interlayer dielectric patterns 20' and 35'. Thus, short circuits between the direct contact plugs 22 and the buried contact plugs 42', that may be caused by the misaligning of the bit line structures 32', may be limited or even completely prevented, which may improve product yield.

The present invention is not limited to the aforementioned embodiments but may vary within the scope of the present invention. For example, the present invention may also be applied to a method of forming an RCAT and/or a spherical recess channel array transistor (SRCAT).

Referring back to FIGS. 1B and 2E, the contact structure in a semiconductor device according to some embodiments of the present invention will be further described. As shown in the embodiments of FIGS. 1B and 2E, the isolation layer 5 defining the active region 7 is formed in the semiconductor substrate 1. The semiconductor substrate 1 may be a silicon wafer. Impurity regions, such as n-wells and/or p-wells, may be formed in the semiconductor substrate 1. The isolation layer 5 may be formed using an STI method. The isolation layer 5 may include an insulating layer, such as a silicon oxide layer, a silicon nitride layer, a silicon oxynitride layer or a combination layer thereof. As illustrated in FIG. 1A, the active region 7 may include a plurality of active regions 7 electrically isolated from one another and regularly arranged in the semiconductor substrate 1.

Gate trenches 10 intersecting the active region 7 are formed in the semiconductor substrate 1. Gate insulating layers 12 are formed along sidewalls and bottom surfaces of the gate trenches 10. The gate trenches 10 may be formed to have a narrower width than a limiting resolution required in a photolithography process. Buried gate electrodes 15 partially filling the gate trenches 10 are formed on the gate insulating layers 12. Capping patterns 17 completely filling the gate trenches 10 are formed on the buried gate electrodes 15. Source/drain regions 19 are formed in the active region 7 at both sides of each of the buried gate electrodes 15. The source/drain regions 19 may include common source/drain regions in the active region 7 between the buried gate electrodes 15.

Top surfaces of the isolation layer 5, the active region 7 and the capping patterns 17 may all have the same level. The gate trenches 10 may be formed to intersect the active region 7 and the isolation layer 5. The gate trenches 10 may be formed to be parallel with one another. The buried gate electrodes 15 may extend to serve as buried word lines 15. The buried gate electrodes 15 may be formed at a lower level than top surfaces of the active regions 7. When the semiconductor device is an RCAT, the word lines may be formed as protruded word lines intersecting the top surface of the semiconductor substrate 1.

The gate trenches 10 may be formed to have various shapes, such as a trapezoid, a lower portion of which has a greater width than an upper portion thereof, and a flask having its spherical lower portion extended. However, the gate trenches 10, each having upper and lower portions with the same width and a rounding lower corner, will be described below.

The gate insulating layer 12 may include a silicon oxide layer, a silicon nitride layer, a silicon oxynitride layer, a high-k dielectric layer or a combination layer thereof. The buried gate electrode 15 may include a metal layer, a metal silicide layer, a poly-silicon layer or a combination layer thereof. For example, the buried gate electrode 15 may include a TiSi layer.

The capping pattern 17 may include a silicon oxide layer, a silicon nitride layer, a silicon oxynitride layer, or a combination layer thereof. For example, the capping pattern 17 may include a silicon nitride layer. The source/drain regions 19 may be formed to have different conductivity type from the semiconductor substrate 1. For example, the semiconductor substrate 1 may include p-type impurity ions, and the source/drain regions 19 may include n-type impurity ions.

Bit line structures 32 contacting the active region 7 through the direct contact plugs 22 and intersecting the gate electrodes 15 are formed on the semiconductor substrate 1 having the source/drain regions 19. The bit line structure 32 may include a bit line conductive pattern 25, a bit line capping pattern 27, which are sequentially stacked, and bit line spacers 30 covering sidewalls of the bit line conductive pattern 25 and the bit line capping pattern 27.

Each of the direct contact plugs 22 and the bit line conductive pattern 25 may include a conductive layer such as a metal layer, a metal silicide layer, a poly-silicon layer and/or a combination layer thereof. For example, the direct contact plug 22 may include a tungsten layer and a barrier metal layer surrounding sidewalls and a bottom of the tungsten layer. The bit line capping pattern 27 and the bit line spacers 30 may be formed of a silicon nitride layer.

The bit line structures 32 may be formed to have a predetermined width. In some embodiments, the bit line structures 32 may be formed such that the width of a region contacting the direct contact plugs 22 is broader than that of a region that does not contact the direct contact plugs 22.

Barrier patterns 37 parallel with the bit line structures 32 are formed on the semiconductor substrate 1 between the bit line structures 32. The barrier patterns 37 may include silicon nitride layers. The barrier patterns 37 may be the same layers as the bit line capping pattern 27 and the bit line spacers 30. Sequentially-stacked first and second interlayer dielectric patterns 20' and 35' may be interposed between the barrier patterns 37 and the semiconductor substrate 1. The barrier patterns 37 may be formed to have a greater width than a limiting resolution required in a photolithography process.

The first interlayer dielectric pattern 20' may be formed in a region between the bit line structures 32 and the semiconductor substrate 1 except the direct contact plugs 22. The bit line capping pattern 27 and the bit line spacers 30 may be formed of a material having an etching selectivity with respect to the first and second interlayer dielectric layers 20' and 35'. The barrier patterns 37 may be formed of a material having an etching selectivity with respect to the first and second interlayer dielectric layers 20' and 35'.

Insulating layer patterns filling a region between the bit line structures 32 and the barrier patterns 37 may be formed in a region adjacent to the direct contact plug 22. Buried contact plugs 42 surrounded by the bit line structures 32, the barrier patterns 37 and the insulating layer patterns may be formed to be symmetric about the bit line structures 32. When the bit line structures 32 have a predetermined width, the buried contact plugs 42 may have a rectangular structure as viewed on the plan view of FIG. 1A. The buried contact plug 42 may include a conductive layer, such as a metal layer, a metal silicide layer, a poly-silicon layer and/or a combination layer thereof.

Storage nodes 45 contacting the respective buried contact plugs 42 are formed on the semiconductor substrate 1 including the buried contact plugs 42. The storage node 45 may include a conductive layer, such as a metal layer, a metal silicide layer, a poly-silicon layer and/or a combination layer thereof. The storage nodes 45 may be electrically connected to the source/drain regions 19 through the buried contact plugs 42. The storage nodes 45 may be lower electrodes of capacitors.

The present invention is not limited to the aforementioned embodiments but may vary within the scope of the present invention. For example, the present invention may also be applied to a method of forming an RCAT and an SRCAT.

As described above, according to some embodiments of the present invention, an interlayer dielectric layer is etched using bit line structures, barrier metal layers formed parallel with the bit line structures between the bit line structures, and mask patterns overlying top surfaces of direct contact plugs in a vertical direction together with bit line structures as an etching mask for forming buried contact holes, thereby exposing source/drain regions. Thus, as viewed on a plan view, the buried contact holes may be formed to be symmetric about the bit line structures, and a contact area may be formed as broad as possible using line and space patterns intersecting the bit line structures in a vertical direction. Accordingly, a margin in a photolithography process can be increased.

As the mask patterns cover the top surfaces of the direct contact plugs, the direct contact plugs are not exposed by the buried contact holes even when the bit line structures are misaligned and partially expose the top surfaces of the direct contact plugs. Accordingly, short circuits between the direct contact plugs and the buried contact plugs, that may be caused by the misaligning of the bit line structures, may be limited or even completely prevented, so that product yield may be improved.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a contact structure in a semiconductor device, comprising:

providing a semiconductor substrate including active regions and word lines crossing the active regions;

forming a first interlayer dielectric layer on the semiconductor substrate;

forming direct contact plugs extending through the first interlayer dielectric layer to contact selected ones of the active regions;

forming bit line structures on the first interlayer dielectric layer and crossing the word lines that are coupled to the selected ones of the active regions by the direct contact plugs;

forming a second interlayer dielectric layer on the semiconductor substrate including the bit line structures;

forming barrier patterns extending in parallel with bit line structures and into the second interlayer dielectric layer, wherein the barrier patterns extend into the second interlayer dielectric layer;

forming mask patterns overlying an entirety of top surfaces of the direct contact plugs on the second interlayer dielectric layer and the bit line structures;

etching the second and first interlayer dielectric layers using the mask patterns, the barrier patterns and the bit line structures as an etching mask to form buried contact holes; and forming buried contact plugs in the buried contact holes, wherein an upper surface of the buried contact plugs is at a same level as an upper surface of the barrier patterns.

2. The method of claim 1, wherein the word lines comprise buried word lines having an upper surface below a top surface of the active regions and/or protruded word lines having an upper surface above the top surface of active regions.

3. The method of claim 1, wherein the bit line structures comprise:

a bit line conductive pattern;

a bit line capping pattern on the bit line conductive pattern; and bit line spacers covering sidewalls of the bit line conductive pattern and the bit line capping pattern.

4. The method of claim 3, wherein the bit line capping pattern and the bit line spacers are formed of a material having an etching selectivity with respect to the first and second interlayer dielectric layers.

5. The method of claim 1, wherein the barrier patterns are formed between the bit line structures.

6. The method of claim 1, wherein forming the barrier patterns comprises:
patterning the second interlayer dielectric layer in a direction parallel with the bit line structures to define grooves therein; and
forming an insulating layer filling the grooves.

7. The method of claim 1, wherein the barrier patterns are formed to be self-aligned with respect to the bit line structures.

8. The method of claim 1, wherein the second interlayer dielectric layer has grooves therein between the bit line structures.

9. The method of claim 1, wherein the barrier patterns are formed of a material having an etching selectivity with respect to the first and second interlayer dielectric layers.

10. The method of claim 1, wherein the mask patterns comprise photoresist patterns and/or hard mask patterns.

11. The method of claim 1, wherein etching the second and first interlayer dielectric layers to form the buried contact holes is followed by removing the mask patterns.

12. A method of forming a contact structure in a semiconductor device, comprising:
providing a semiconductor substrate including active regions and word lines crossing the active regions;
forming a first interlayer dielectric layer on the semiconductor substrate;
forming direct contact plugs extending through the first interlayer dielectric layer to contact selected ones of the active regions;
forming bit line structures on the first interlayer dielectric layer and crossing the word lines that are coupled to the selected ones of the active regions by the direct contact plugs;
forming a second interlayer dielectric layer on the semiconductor substrate including the bit line structures;
forming barrier patterns extending in parallel with bit line structures and into the second interlayer dielectric layer;
forming mask patterns overlying an entirety of top surfaces of the direct contact plugs on the second interlayer dielectric layer and the bit line structures;
etching the second and first interlayer dielectric layers using the mask patterns, the barrier patterns and the bit line structures as an etching mask to form buried contact holes; and
forming buried contact plugs in the buried contact holes,
wherein the bit line structures comprise a bit line conductive pattern, a bit line capping pattern on the bit line conductive pattern and bit line spacers covering sidewalls of the bit line conductive pattern and the bit line capping pattern; and
wherein forming the direct contact plugs and forming the bit line structures comprise:
patterning the first interlayer dielectric layer to form direct contact holes exposing the selected ones of the active regions;
forming a bit line conductive layer filling the direct contact holes;
forming a bit line capping layer on the bit line conductive layer;
sequentially patterning the bit line capping layer and the bit line conductive layer to form the direct contact plugs, the bit line conductive pattern and the bit line capping pattern; and
forming bit line spacers covering sidewalls of the bit line conductive pattern and the bit line capping pattern.

13. A method of forming a contact structure in a semiconductor device, comprising:
providing a semiconductor substrate including active regions and word lines crossing the active regions;
forming a first interlayer dielectric layer on the semiconductor substrate;
forming direct contact plugs extending through the first interlayer dielectric layer to contact selected ones of the active regions;
forming bit line structures on the first interlayer dielectric layer and crossing the word lines that are coupled to the selected ones of the active regions by the direct contact plugs;
forming a second interlayer dielectric layer on the semiconductor substrate including the bit line structures;
forming barrier patterns extending in parallel with bit line structures and into the second interlayer dielectric layer;
forming mask patterns overlying an entirety of top surfaces of the direct contact plugs on the second interlayer dielectric layer and the bit line structures;
etching the second and first interlayer dielectric layers using the mask patterns, the barrier patterns and the bit line structures as an etching mask to form buried contact holes; and
forming buried contact plugs in the buried contact holes, and
wherein the second interlayer dielectric layer has grooves therein between the bit line structures and wherein forming the barrier patterns comprises:
forming an insulating layer to fill the grooves in the second interlayer dielectric layer; and
planarizing the semiconductor substrate including the insulating layer in the grooves to expose top surfaces of the bit line structures.

14. A method of forming a contact structure in a semiconductor device, comprising:
providing a semiconductor substrate including active regions and word lines crossing the active regions;
forming a first interlayer dielectric layer on the semiconductor substrate;
forming direct contact plugs extending through the first interlayer dielectric layer to contact selected ones of the active regions;
forming bit line structures on the first interlayer dielectric layer and crossing the word lines that are coupled to the selected ones of the active regions by the direct contact plugs;
forming a second interlayer dielectric layer on the semiconductor substrate including the bit line structures;
forming barrier patterns extending in parallel with bit line structures and into the second interlayer dielectric layer;
forming mask patterns overlying an entirety of top surfaces of the direct contact plugs on the second interlayer dielectric layer and the bit line structures;
etching the second and first interlayer dielectric layers using the mask patterns, the barrier patterns and the bit line structures as an etching mask to form buried contact holes; and
forming buried contact plugs in the buried contact holes,
wherein the bit line structures are formed to have a predetermined substantially fixed width or having a width of a region contacting the direct contact plugs that is broader than that of a region that does thereof that does not contact the direct contact plugs.

* * * * *